(12) United States Patent
Nagai et al.

(10) Patent No.: US 9,133,308 B2
(45) Date of Patent: Sep. 15, 2015

(54) RESIN COMPOSITION, AND PRINTED WIRING BOARD, LAMINATED SHEET, AND PREPREG USING SAME

(75) Inventors: Shunsuke Nagai, Ibaraki (JP); Masato Miyatake, Ibaraki (JP); Tomohiko Kotake, Ibaraki (JP); Shintaro Hashimoto, Ibaraki (JP); Yasuo Inoue, Ibaraki (JP); Shin Takanezawa, Ibaraki (JP); Hikari Murai, Ibaraki (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 13/980,393

(22) PCT Filed: Jan. 17, 2012

(86) PCT No.: PCT/JP2012/050878
§ 371 (c)(1),
(2), (4) Date: Sep. 18, 2013

(87) PCT Pub. No.: WO2012/099134
PCT Pub. Date: Jul. 26, 2012

(65) Prior Publication Data
US 2014/0000948 A1 Jan. 2, 2014

(30) Foreign Application Priority Data
Jan. 18, 2011 (JP) ................................. 2011-008309

(51) Int. Cl.
| | |
|---|---|
| *C08G 77/26* | (2006.01) |
| *C08G 77/14* | (2006.01) |
| *C08J 5/24* | (2006.01) |
| *C08L 79/08* | (2006.01) |
| *H05K 1/03* | (2006.01) |
| *C08L 83/06* | (2006.01) |
| *C08K 5/13* | (2006.01) |
| *C08K 5/18* | (2006.01) |
| *C08K 5/3415* | (2006.01) |
| *C08K 5/3445* | (2006.01) |
| *C08G 73/06* | (2006.01) |
| *C08G 77/388* | (2006.01) |

(52) U.S. Cl.
CPC . *C08G 77/14* (2013.01); *C08J 5/24* (2013.01); *C08L 79/085* (2013.01); *C08L 83/06* (2013.01); *H05K 1/0313* (2013.01); *H05K 1/0353* (2013.01); *C08G 73/0655* (2013.01); *C08G 77/26* (2013.01); *C08G 77/388* (2013.01); *C08J 2379/08* (2013.01); *C08K 5/13* (2013.01); *C08K 5/18* (2013.01); *C08K 5/3415* (2013.01); *C08K 5/3445* (2013.01); *H05K 1/0366* (2013.01); *H05K 2201/0162* (2013.01)

(58) Field of Classification Search
CPC ........ C08G 77/26; C08L 79/085; C08K 5/18; C08K 5/3415; C08K 5/13
USPC ....................................... 528/38, 28
See application file for complete search history.

(56) References Cited

U.S. PATENT DOCUMENTS

| | | | | |
|---|---|---|---|---|
| 4,847,154 | A | * | 7/1989 | Ryang ............................ 428/415 |
| 2010/0210745 | A1 | * | 8/2010 | McDaniel et al. ............... 521/55 |
| 2012/0077401 | A1 | * | 3/2012 | Kotake et al. .................. 442/147 |

FOREIGN PATENT DOCUMENTS

| | | |
|---|---|---|
| JP | 2-269159 | 11/1990 |
| JP | 5-148343 | 6/1993 |
| JP | 6-122765 | 5/1994 |
| JP | 11-124487 | 5/1999 |
| JP | 2000-323804 | 11/2000 |
| JP | 2002-121520 | 4/2002 |
| JP | 2007-131842 | 5/2007 |
| JP | 2007-314748 | 12/2007 |
| JP | 2008-95014 | 4/2008 |
| JP | 2010-174062 | 8/2010 |
| WO | WO 2010/110433 A1 | 9/2010 |

OTHER PUBLICATIONS

JP 2000 323804 Machine translation (2000).*
JP 2007 314748 Machine translation (2007).*
European Search Report dated Mar. 6, 2014, including a Supplementary European Search Report and a European Search Opinion, for EP Application No. 12737159.9-1301/2666826 (PCT/JP2012/050878).

* cited by examiner

*Primary Examiner* — Kuo-Liang Peng
(74) *Attorney, Agent, or Firm* — Fitch, Even, Tabin & Flannery, LLP

(57) ABSTRACT

There are provided a resin composition including: (a) a maleimide compound with at least two N-substituted maleimide groups per molecular structure; and (b) a silicone compound with at least one amino group per molecular structure and also provided a prepreg, a laminated plate, and a printed wiring board that are formed by using this resin composition. The multi-layered printed wiring board produced by using the laminated plate produced by laminating and molding the prepreg obtained from the resin composition of the present invention has excellent glass transition temperature, coefficient of thermal expansion, solder heat resistance, and warp characteristics. The multi-layered printed wiring board is useful as a highly integrated printed wiring board for an electronic device.

17 Claims, No Drawings

RESIN COMPOSITION, AND PRINTED WIRING BOARD, LAMINATED SHEET, AND PREPREG USING SAME

TECHNICAL FIELD

The present invention relates to a resin composition used for an electronic component and the like with insulating properties, heat resistance, and the like, particularly excellent low thermal expansion properties and also relates to a prepreg, a laminated plate, and a printed wiring board that are formed by using this resin composition.

BACKGROUND ART

Associated with a trend toward miniaturization and high performance of an electronic device in recent years, in a printed wiring board, high wiring density and high integration have been developed. This steps up to demands for reliability improvement by enhancing the heat resistance of the laminated plate for wiring. In such an application, the laminated plate is required to have not only excellent heat resistance but also a low thermal expansion coefficient.

The laminated plate for a printed wiring board generally is formed by curing and integrating a resin composition mainly composed of an epoxy resin and a glass woven fabric. The epoxy resin is generally excellent in a balance among insulating properties, heat resistance, a cost, and the like. However, to respond to the request for improving of the heat resistance in accordance with the high-density packaging and the highly multi-layered structure of a printed wiring board of recent years, the improvement of the heat resistance is inevitably limited. The high coefficient of thermal expansion is attempted to be lowered by choosing an epoxy resin with an aromatic ring or by highly filling an inorganic filler such as silica (see Patent Document 1).

Associated with a trend toward being smaller and thinner in recent years, a package substrate for a semiconductor has a major problem of a warp caused by the difference between the coefficients of thermal expansion of a chip and a substrate at the time of component mounting or package assembling. This requires a low coefficient of thermal expansion to be lowered. However, the increased amount of the filler is known to cause the lowered insulation reliability due to moisture absorption, the insufficient adhesion between the resin composition layer and the wiring layer, and the failure of press molding.

PRIOR ART DOCUMENTS

Patent Documents

[Patent Document 1] JP-A-5-148343

SUMMARY OF THE INVENTION

Problems to be Solved by the Invention

In view of the current situation, the objective of the present invention is to provide a resin composition, particularly with excellent heat resistance and low thermal expansion properties and also to provide a prepreg, a laminated plate, and a printed wiring board that are formed by using this composition.

Means for Solving the Problems

As a result of their extensive studies to accomplish the objective, the inventors found that a resin composition containing a poly-bis-maleimide resin and a silicone resin with an amino group is appropriate for the above-mentioned objective.

The present invention provides a resin composition, a prepreg laminated plate, and a printed wiring board as described below.
1. A resin composition including: (a) a maleimide compound with at least two N-substituted maleimide groups per molecular structure; and (b) a silicone compound with at least one amino group per molecular structure.
2. The resin composition according to the above-mentioned 1 further including (c) a compound with a phenolic hydroxyl group per molecular structure.
3. The resin composition according to the above-mentioned 1 or 2 further including (d) a thermosetting resin.
4. The resin composition according to any one of the above-mentioned 1-3, in which the silicone compound (b) has at least two amino groups per molecular structure.
5. The resin composition according to any one of the above-mentioned 1-3, in which the silicone compound (b) has an amino group at both ends.
6. The resin composition according to any one of the above-mentioned 1-3, in which the silicone compound (b) has an amino group at either end.
7. The resin composition according to any one of the above-mentioned 1-3, in which the silicone compound (b) has an amino group at the side chain.
8. The resin composition according to any one of the above-mentioned 1-3, in which the silicone compound (b) has an amino group at the side chain and at least one end.
9. The resin composition according to any one of the above-mentioned 1-8, in which the compound (c) has an amino group and a phenolic hydroxyl group per molecular structure.
10. The resin composition according to any one of the above-mentioned 1-9, in which the compound (c) is a multifunctional phenolic resin.
11. The resin composition according to any one of the above-mentioned 1-10, in which the compound (d) has an epoxy group and/or a cyanate group per molecular structure.
12. The resin composition according to any one of the above-mentioned 1-11 further including (e) a curing accelerator represented by the following general formula (I) or (II)

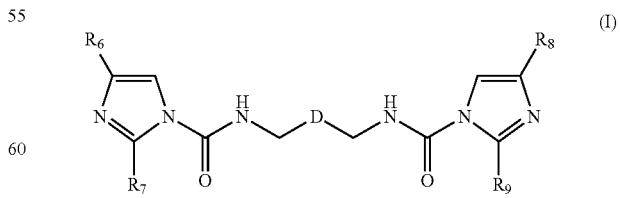

In the formula, $R_6$, $R_7$, $R_8$, and $R_9$ each independently represents a hydrogen atom, an aliphatic hydrocarbon group with 1-5 carbon atoms, or a phenyl group; and D is an alkylene group or an aromatic hydrocarbon group.

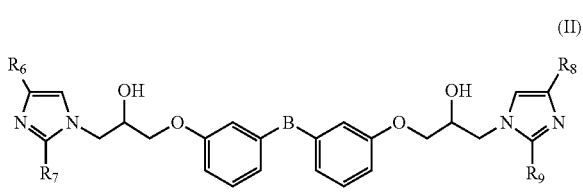

(II)

In the formula, $R_6$, $R_7$, $R_8$, and $R_9$ each independently represents a hydrogen atom, an aliphatic hydrocarbon group with 1-5 carbon atoms, or a phenyl group; and B represents a single bond or any one of an alkylene group, an alkylidene group, an ether group, and a sulfonyl group.

13. The resin composition according to any one of the above-mentioned 1-12 further including (f) an inorganic filler.
14. A prepreg formed by using the resin composition according to any one of the above-mentioned 1-13.
15. A laminated plate formed by using the prepreg according to the above-mentioned 14 through laminate molding.
16. A printed wiring board produced by using the laminated plate according to the above-mentioned 15.

Effects of the Invention

A prepreg formed by impregnating or coating a base material with the resin composition of the present invention, a laminated plate produced by laminating and molding this prepreg, and a multi-layered printed wiring board produced by using the laminated plate have an excellent glass transition temperature, coefficient of thermal expansion, solder heat resistance, and warp characteristics. Therefore, the prepreg, the laminated plate, and the multi-layered printed wiring board are useful as a printed wiring board for an electronic device.

MODES FOR CARRYING OUT THE INVENTION

The present invention will be explained in detail below. The present invention is a resin composition including: (a) a maleimide compound with at least two N-substituted maleimide groups per molecular structure; and (b) a silicone compound with at least one amino group per molecular structure.

The maleimide compound with at least two N-substituted maleimide groups per molecular structure (a) in the resin composition of the present invention includes, for example, N,N'-ethylenebismaleimide, N,N'-hexamethylenebismaleimide, N,N'-(1,3-phenylene)bismaleimide, N,N'-[1,3-(2-methylphenylene)]bismaleimide, N,N'-[1,3-(4-methylphenylene)]bismaleimide, N,N'-(1,4-phenylene)bismaleimide, bis(4-maleimide phenyl)methane, bis(3-methyl-4-maleimide phenyl)methane, 3,3-dimethyl-5,5-diethyl-4,4-diphenylmethane bismaleimide, bis(4-maleimide phenyl)ether, bis(4-maleimide phenyl)sulfone, bis(4-maleimide phenyl)sulfide, bis(4-maleimide phenyl)ketone, bis(4-maleimide cyclohexyl)methane, 1,4-bis(4-maleimide phenyl)cyclohexane, 1,4-bis(maleimide methyl)cyclohexane, 1,4-bis(maleimide methyl)benzene, 1,3-bis(4-maleimidephenoxy)benzene, 1,3-bis(3-maleimidephenoxy)benzene, bis[4-(3-maleimidephenoxy)phenyl]methane, bis[4-(4-maleimidephenoxy)phenyl]methane, 1,1-bis[4-(3-maleimidephenoxy)phenyl]ethane, 1,1-bis[4-(4-maleimidephenoxy)phenyl]ethane, 1,2-bis[4-(3-maleimidephenoxy)phenyl]ethane, 1,2-bis[4-(4-maleimidephenoxy)phenyl]ethane, 2,2-bis[4-(3-maleimidephenoxy)phenyl]propane, 2,2-bis[4-(4-maleimidephenoxy)phenyl]propane, 2,2-bis[4-(3-maleimidephenoxy)phenyl]butane, 2,2-bis[4-(4-maleimidephenoxy)phenyl]butane, 2,2-bis[4-(3-maleimidephenoxy)phenyl]-1,1,1,3,3,3-hexafluoropropane, 2,2-bis[4-(4-maleimidephenoxy)phenyl]-1,1,1,3,3,3-hexafluoropropane, 4,4-bis(3-maleimidephenoxy)biphenyl, 4,4-bis(4-maleimidephenoxy)biphenyl, bis[4-(3-maleimidephenoxy)phenyl]ketone, bis[4-(4-maleimidephenoxy)phenyl]ketone, 2,2'-bis(4-maleimide phenyl)disulfide, bis(4-maleimide phenyl)disulfide, bis[4-(3-maleimidephenoxy)phenyl]sulfide, bis[4-(4-maleimidephenoxy)phenyl]sulfide, bis[4-(3-maleimidephenoxy)phenyl]sulfoxide, bis[4-(4-maleimidephenoxy)phenyl]sulfoxide, bis[4-(3-maleimidephenoxy)phenyl]sulfone, bis[4-(4-maleimidephenoxy)phenyl]sulfone, bis[4-(3-maleimidephenoxy)phenyl]ether, bis[4-(4-maleimidephenoxy)phenyl]ether, 1,4-bis[4-(4-maleimidephenoxy)-α,α-dimethylbenzyl]benzene, 1,3-bis[4-(4-maleimidephenoxy)-α,α-dimethylbenzyl]benzene, 1,4-bis[4-(3-maleimidephenoxy)-α,α-dimethylbenzyl]benzene, 1,3-bis[4-(3-maleimidephenoxy)-α,α-dimethylbenzyl]benzene, 1,4-bis[4-(4-maleimidephenoxy)-3,5-dimethyl-α,α-dimethylbenzyl]benzene, 1,3-bis[4-(4-maleimidephenoxy)-3,5-dimethyl-α,α-dimethylbenzyl]benzene, 1,4-bis[4-(3-maleimidephenoxy)-3,5-dimethyl-α,α-dimethylbenzyl]benzene, 1,3-bis[4-(3-maleimidephenoxy)-3,5-dimethyl-α,α-dimethylbenzyl]benzene, and polyphenylmethane maleimide (for example, trade name: BMI-2300, available from Daiwa Fine Chemicals Co., Ltd.,). These maleimide compounds may be used alone or in combination with two kinds or more.

In these maleimide compounds, bis(4-maleimide phenyl)methane, bis(4-maleimide phenyl)sulfone, N,N'-(1,3-phenylene)bismaleimide, 2,2-bis(4-(4-maleimidephenoxy)phenyl)propane, and polyphenylmethane maleimide can preferably provide high reaction rate and higher thermostability. Particularly, from the viewpoint of the solubility in a solvent, bis(4-maleimide phenyl)methane is particularly preferable.

As the silicone compound with at least one amino group per molecular structure (b), a silicone compound with at least two amino groups per molecular structure is suitably used. Furthermore, a silicone compound with an amino group at the both ends of the above-mentioned silicone structure, a silicone compound with an amino group at the either end, a silicone compound with an amino group at the side chain, and a silicone compound with an amino group at the side chain and at least one end.

As the silicone compound with at least one amino group per molecular structure (b) includes a commercially available material can be used including, for example, "KF-8010" (amine equivalent: 430), "X-22-161A" (amine equivalent: 800), "X-22-161B" (amine equivalent: 1500), "KF-8012" (amine equivalent: 2200), "KF-8008" (amine equivalent: 5700), "X-22-9409" (amine equivalent: 700), and "X-22-16608-3" (amine equivalent: 2200) (available from Shin-Etsu Chemical Co., Ltd.); and "BY-16-853U" (amine equivalent: 460), "BY-16-853" (amine equivalent: 650), and "BY-16-853B" (amine equivalent: 2200) (available from Dow Corning Toray Co., Ltd.). These may be used alone or in combination with two or more kinds. Among these, X-22-161A, X-22-161B, KF-8012, KF-8008, X-22-1660B-3, and BY-16-853B are preferable from the viewpoint of the low water absorbability, and X-22-161A, X-22-161B, and KF-8012 are particularly preferable from the viewpoint of the low thermal expansion properties. These may be used alone or in combination with two or more kinds.

The amount used of the component (b) is preferably 5-100 parts by mass, more preferably 30-50 parts by mass based on 100 parts by mass of the component (a). Adjusting the amount used to 5 parts by mass or more improves the low thermal expansion. Adjusting the amount used to 100 parts by mass or less improves the moldability.

The resin composition of the present invention preferably further contains a compound with a phenolic hydroxyl group (c).

The compound with a phenolic hydroxyl group in the molecular structure (c) includes, for example, bisphenol A, bisphenol F, bisphenol S, 4,4-biphenylphenol, tetramethyl bisphenol A, dimethyl bisphenol A, tetramethyl bisphenol F, dimethyl bisphenol F, tetramethyl bisphenol S, dimethyl bisphenol S, tetramethyl-4,4-biphenol, dimethyl-4,4-biphenylphenol, 1-(4-hydroxyphenyl)-2-[4-(1,1-bis-(4-hydroxyphenyl)ethyl)phenyl]propane, 2,2-methylene-bis(4-methyl-6-tert-butylphenol), 4,4-butylidene-bis(3-methyl-6-tert-butylphenol), tris hydroxyphenyl methane, resorcinol, hydroquinone, pyrogallol, a phenol with a diisopropylidene skeleton, a phenol with a fluorene skeleton such as 1,1-di-4-hydroxyphenyl fluorene, and various novolac resins such as a novolac resin prepared from various phenols such as phenolated polybutadiene, phenol, cresols, ethylphenols, butylphenols, octylphenols, bisphenol A, bisphenol F, bisphenol S, and naphthols, a xylylene skeleton-containing phenol novolac resin, a dicyclopentadiene skeleton-containing phenol novolac resin, a biphenyl skeleton-containing phenol novolac resin, and a fluorene skeleton-containing phenol novolac resin.

The compound with an amino group and a phenolic hydroxyl group in the molecular structure (c) includes, for example, m-aminophenol, p-aminophenol, o-aminophenol, p-aminobenzoic acid, m-aminobenzoic acid, o-aminobenzoic acid, o-aminobenzenesulfonic acid, m-aminobenzenesulfonic acid, p-aminobenzenesulfonic acid, 3,5-dihydroxyaniline, and 3,5-dicarboxy aniline. These may be used alone or in combination with two or more kinds. Among these, from the viewpoint of the solubility and the synthetic yield, m-aminophenol, p-aminophenol, o-aminophenol, p-aminobenzoic acid, m-aminobenzoic acid, and 3,5-dihydroxyaniline are preferable. From the viewpoint point of the heat resistance, m-aminophenol and p-aminophenol are more preferable. From the viewpoint of the dielectric characteristics, p-aminophenol is particularly preferable.

When having an amino group and a phenolic hydroxyl group in the molecular structure, the compound (c) can previously be reacted with a maleimide compound with at least two N-substituted maleimide groups in the molecular structure (a) by being stirred in an organic solvent for 0.1-10 hours while being heated to be maintained hot if necessary.

In this case, the compound with an amino group and a phenolic hydroxyl group (c) is preferably p-aminophenol from the viewpoint of the low thermal expansion properties. For the amount used of the silicone compound (b) and the compound with an amino group and a phenolic hydroxyl group (c), the following expression relating the total —NH$_2$ group equivalent to the maleimide group equivalent of the maleimide compound (a) is preferably true:

2.0≤(maleimide group equivalent)/(—NH$_2$ group equivalent)≤10.0

If the equivalence ratio exceeds 10.0, the solubility in a solvent may be insufficient, or the heat resistance of the laminate plated may decrease. If the equivalence ratio is less than 2.0, gelation may be caused, or the heat resistance of the laminated plate may decrease.

The amount used of the component (c) is preferably 1-50 parts by mass, more preferably 5-20 parts by mass based on 100 parts by mass of the component (a) while the above-mentioned relational expression is satisfied. Adjusting the amount used to 1 part by mass or more improves the desmear resistance. Adjusting the amount used to 50 parts by mass or less improves the heat resistance.

The amount used of the organic solvent is preferably 10-1000 parts by mass, more preferably from 100-500 parts by mass, and particularly preferably 200-500 parts by mass based on 100 parts by mass of a total amount of the components (a) and (c). If the amount used of the organic solvent is small, the solubility is insufficient. If the amount used of the organic solvent exceeds 1000 parts by mass, the synthesis requires a long time.

The organic solvent used in this reaction is not limited in particular but includes, for example, alcohol solvents such as ethanol, propanol, butanol, methyl cellosolve, butyl cellosolve, and propylene glycol methyl ether; ketone solvents such as acetone, methyl ethyl ketone, methyl isobutyl ketone, and cyclohexanone; an ether solvent such as tetrahydrofurane; aromatic solvents such as toluene, xylene, and mesitylene; nitrogen atom containing solvents such as dimethylformamide, dimethylacetamide, and N-methylpyrrolidone; a sulfur-atom containing solvent such as a dimethylsulfoxide. These may be used alone or in combination of two or more kinds. Among these, from the viewpoints of the solubility, cyclohexanone, propylene glycol monomethyl ether, and methyl cellosolve are preferable. From the viewpoint of the low toxicity, cyclohexanone and propylene glycol monomethyl ether are more preferable. From the viewpoint of hardly remaining as a residual solvent due to high volatility at the time of producing the prepreg, propylene glycol monomethyl ether is particularly preferable.

For this reaction, any catalysts can be used with no limitation in particular if necessary. The example of the catalyst includes amines such as of triethylamine, pyridine, and tributylamine; imidazoles such as methylimidazole and phenylimidazole; and a phosphorous catalyst such as triphenylphosphine. These may be used alone or in combination of two or more kinds. When the above-mentioned components (a) and (c) are reacted in an organic solvent, the reaction temperature is preferably 70-150° C., more preferably 100-130° C. Furthermore, the reaction time is preferably 0.1-10 hours, more preferably 1-6 hours.

The resin composition of the present invention preferably further contains a thermosetting resin (d). The thermosetting resin (d) is not limited in particular but includes, for example, an epoxy resin, a phenol resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin, and a melamine resin. These may be used alone or in combination with two or more kinds. Among these, from the viewpoint of the moldability and the electrical insulating properties, an epoxy resin and a cyanate resin are preferable.

The epoxy resin includes, for example, a bisphenol A epoxy resin, a bisphenol F epoxy resin, a bisphenol S epoxy resin, a phenol novolac epoxy resin, a cresol novolac epoxy resin, a bisphenol A novolac epoxy resin, a bisphenol F novolac epoxy resin, a stilbene epoxy resin, a triazine skeleton-containing epoxy resin, a fluorene skeleton-containing epoxy resin, a triphenol phenol methane epoxy resin, a biphenyl epoxy resin, a xylylene epoxy resin, a biphenyl aralkyl epoxy resin, a naphthalene epoxy resin, a dicyclopentadiene epoxy resin, an alicyclic epoxy resin, a diglycidyl ether compound of a polyfunctional phenol or a polycyclic aromatic compound such as anthracene, and a phosphorus-containing epoxy resin obtained by introducing a phosphorus compound to these resins. These may be used alone or in combination with two or more kinds. Among these, from the viewpoint of the heat resistance and the incombustibility, a biphenyl aralkyl epoxy resin and a naphthalene epoxy resin are preferable.

The cyanate resin includes, for example, a novolac cyanate resin, bisphenol cyanate resins such as a bisphenol A cyanate resin, a bisphenol E cyanate resin, and a tetramethyl bisphenol F cyanate resin, and a prepolymer obtained by converting a part of such a resin into triazine. These may be used alone or in combination with two or more kinds. Among these, from the viewpoint of the heat resistance and the incombustibility, a novolac cyanate resin is preferable.

The amount used of the component (d) is preferably 20-300 parts by mass, more preferably 50-150 parts by mass based on 100 parts by mass of the component (a). Adjusting the amount used to 20 parts by mass or more improves the heat resistance. Adjusting the amount used to 300 part by mass or less improves the desmear resistance.

For the resin composition of the present invention, the curing accelerator (e) is preferably used to improve the heat resistance, the incombustibility, the copper foil adhesion, and the like. The example of the curing accelerator includes imidazoles and the derivatives thereof, tertiary amines, and quaternary ammonium salts.

Among these, imidazoles and the derivatives thereof are preferable from the viewpoints of the heat resistance, the incombustibility, the copper foil adhesion, and the like. In addition, the isocyanate resin represented by the following general formula (I) and the compound substituted with a compound in which an imidazole group represented by the following general formula (II) is substituted with an epoxy resin are more preferable because of the excellent curing moldability at a relatively low temperature equal to or less than 200° C. or less and because of the contribution to the stability with time of the varnish and the prepreg. Specifically the compound represented by the following formula (III) or (IV) is particularly preferable because of the small blending amount to be used and the commercially inexpensive price.

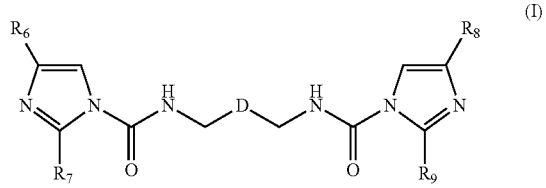

(I)

In the formula, $R_6$, $R_7$, $R_8$, and $R_9$ each independently represents a hydrogen atom, an aliphatic hydrocarbon group with 1-5 carbon atoms, or a phenyl group; and D is an alkylene group or an aromatic hydrocarbon group.

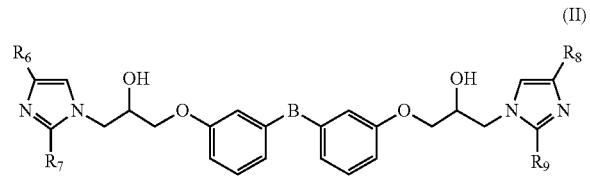

(II)

In the formula, $R_6$, $R_7$, $R_8$, and $R_9$ each independently represents a hydrogen atom, an aliphatic hydrocarbon group with 1-5 carbon atoms, or a phenyl group; and B represents a single bond or any one of an alkylene group, an alkylidene group, an ether group, and a sulfonyl group.

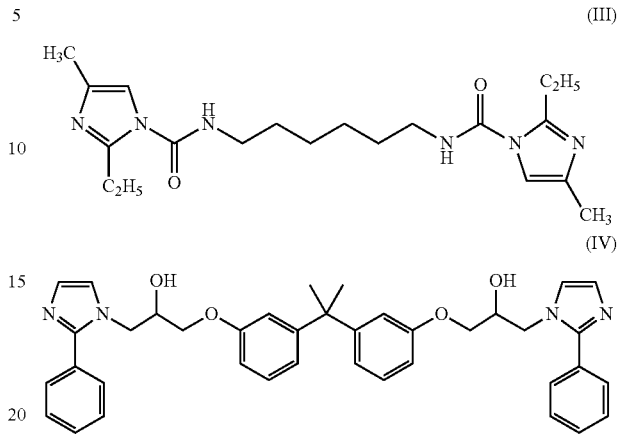

The amount used of the curing accelerator (e) is preferably 0.1-10 parts by mass, more preferably 0.1-5 parts by mass, and especially preferably 0.1-1 part by mass based on 100 parts by mass of a total amount of the components (a)-(d) as reduced into a solid. Adjusting the amount used to 0.1 parts by mass or more provides excellent heat resistance, incombustibility, and copper foil adhesion. Adjusting the amount used to 10 parts by mass or less never lowers the heat resistance, the stability with time, and the press moldability.

The resin composition of the present invention can be optionally used together with an inorganic filler (f). The inorganic filler includes silica, alumina, talc, mica, kaolin, aluminum hydroxide, boehmite, magnesium hydroxide, zinc borate, zinc stannate, zinc oxide, titanium oxide, boron nitride, calcium carbonate, barium sulfate, aluminum borate, potassium titanate, and glass powder and hollow glass beads of E-glass, T-glass, and D-glass. These may be used alone or in combination with two or more kinds.

Among these, from the viewpoint of the dielectric characteristics, the heat resistance, and the low thermal expansion properties, silica is particularly preferable. The silica include, for example, precipitated silica with a high water content, which is prepared by a wet process; and dry process silica with substantially no bonding water, which is prepared by a dry process. Furthermore, the dry process silica includes crushed silica, fumed silica, and fused spherical silica that are generated based on the difference in the producing methods. Among these, fused spherical silica is preferable from the viewpoint of the low thermal expansion properties and the high fluidity when filled in the resin.

When used as the inorganic filler (f), the fused spherical silica preferably has an average particle size of preferably 0.1-10 μm, more preferably 0.3-8 μm. Adjusting the average particle size to 0.1 μm or more can suitably maintain the fluidity when the silica is filled in the resin. Adjusting the average particle size to 10 μm or less can decrease the probability of incorporating coarse particles so that failure caused by coarse particles can be controlled. The average particle size is herein referred to as a particle size indicated by the point corresponding to exactly 50% of the volume of particles determined from a cumulative distribution curve of particle size, in which the total volume of particles is defined as 100%. The average particle size can be measured by a particle size distribution analyzer adopting a laser diffraction scattering method or the like.

The content of the inorganic filler (f) is preferably 10-70 parts by mass, and more preferably 30-55 parts by mass based on 100 parts by mass of the total content of the components (a)-(d) as reduced into a solid. Adjusting the content of the inorganic filler to 10-70 parts by mass based on 100 parts by mass of the total content of the resin components can suitably maintain the moldability and the low thermal expansion properties of the resin composition.

In the present invention, a well-known thermoplastic resin, elastomer, flame retarder, organic filler, and the like can be optionally used to the extent consistent with the objective.

The example of the thermoplastic resin includes tetrafluoroethylene, polyethylene, polypropylene, polystyrene, a polyphenylene ether resin, a phenoxy resin, a polycarbonate resin, a polyester resin, a polyamide resin, a polyimide resin, a xylene resin, a petroleum resin, and a silicone resin.

The example of the elastomer includes polybutadiene, acrylonitrile, epoxy-modified polybutadiene, maleic anhydride-modified polybutadiene, phenol-modified polybutadiene, and carboxy-modified acrylonitrile.

The example of the organic filler includes a silicone powder and organic material powders of tetrafluoroethylene, polyethylene, polypropylene, polystyrene, and polyphenylene ether.

In the present invention, in the thermosetting resin composition, an ultraviolet light absorber, an antioxidant, a photopolymerization initiator, a fluorescent brightener, and an adhesion improver can also be added with no limitation in particular. The examples of these include an ultraviolet light absorber based on benzotriazole or the like; an antioxidant based on hindered phenol and an antioxidant such as styrenated phenol; photopolymerization initiators such as benzophenones and benzyl ketals, a photopolymerization initiator based on thioxanthone or the like; a fluorescent brightener such as a stilbene derivative; a urea compound such as silane urea; and an adhesion improver such as a silane coupling agent.

The resin composition of the present invention is used in varnish. The organic solvent used when the vanish is prepared is not limited in particular but includes, for example, alcohol solvents such as ethanol, propanol, butanol, methyl cellosolve, butyl cellosolve, and propylene glycol methyl ether; ketone solvents such as acetone, methyl ethyl ketone, methyl isobutyl ketone, and cyclohexanone; an ether solvent such as tetrahydrofurane; aromatic solvents such as toluene, xylene, and mesitylene; nitrogen atom-containing solvents such as dimethylformamide, dimethylacetamide, and N-methylpyrrolidone; a sulfur-atom containing solvent such as a dimethylsulfoxide. These may be used alone or in combination of two or more kinds. Among these, from the viewpoints of the solubility, cyclohexanone, propylene glycol monomethyl ether, and methyl cellosolve are preferable. From the viewpoint of the low toxicity, cyclohexanone and propylene glycol monomethyl ether are more preferable. From the viewpoint of hardly remaining as a residual solvent due to high volatility at the time of producing the prepreg, propylene glycol monomethyl ether is particularly preferable.

The varnish is preferably used in a solid content concentration of 40-80 mass %.

The prepreg of the present invention is formed by coating or impregnating a base material with the above-mentioned resin composition of the present invention. The prepreg of the present invention will be explained in detail below.

The prepreg of the present invention can be produced by coating or impregnating a base material with the resin composition of the present invention, followed by semi-curing (B-staging) by heating or the like. As the base material of the present invention, well-known base materials used for various multi-layered boards for electrical insulating material can be used. The material includes inorganic fibers such as E-glass, D-glass, S-glass, and Q-glass; organic fibers such as polyimide, polyester, and polytetrafluoroethylene, and a mixture thereof.

These base materials have the shapes of, for example, woven fabric, nonwoven fabric, roving, a chopped strand mat, and a surfacing mat. The material and the shape are selected in accordance with the application and the performance of a target molded product and can be used alone or in combination with the two or more kinds if necessary. The thickness of the base material is not limited in particular. For example, the base material with a thickness of about 0.03-0.5 mm can be used. The base material formed by a surface treatment with a silane coupling agent or the like or formed by a mechanical opening treatment is suitable from the viewpoint of the heat resistance, the moisture resistance, and the processability.

The prepreg of the present invention can be obtained by impregnating or coating the base material with the varnish so that the amount of the resin composition attached to the base material is 20-90 mass % in terms of a resin content of the prepreg after dried and then by typically drying by heating at a temperature of 100-200° C. for 1-30 minutes for semi-curing (B-staging).

The laminated plate of the present invention can be formed by using the above-mentioned prepreg of the present invention through laminate molding. The laminated plate can be, for example, produced by laminate molding in the structure in which 1-20 sheets of the prepreg of the present invention are deposited, and a metal foil such as copper or aluminum is disposed on either or both surfaces of the sheets. The metal foil is not particularly limited so far as it is one to be used for an application of electrical insulating materials.

To the molding condition for producing the laminated plate, for example, techniques for a laminated plate and a multi-layered board for electrical insulating material can be applied. More specifically, the molding can be performed at a temperature of 100-250° C. under a pressure of 0.2-10 MPa for a heating time of 0.1-5 hours by using a multi-stage press, a multi-stage vacuum press, a continuous molding machine, or an autoclave molding machine. Alternatively, the prepreg of the present invention can be combined with a printed wiring board for the inner layer and subjected to laminate molding to produce the laminated plate.

The printed wiring board according to the present invention is produced by forming a circuit on the surface of the laminated plate. Specifically, the conductor layer of the laminated plate according to the present invention is subjected to a wiring process by a typical etching method, and a plurality of the wiring-processed laminated plates are deposited with the above-mentioned prepreg being sandwiched. These deposited laminated plates are collectively multi-layered by a heat press process. Thereafter, a multi-layered printed wiring board can be produced through the formation of a through-hole or a blind via hole by means of drill processing or laser processing and the formation of an interlayer wiring by means of plating or with an electrically conductive paste.

EXAMPLES

The present invention will be explained in more detail with reference to the following examples. However, it should be construed that these examples do not limit the present invention at all in any meanings.

The copper clad laminated plate obtained in each of the examples and the comparative examples was used to measure and evaluate the glass transition temperature, the coefficient of thermal expansion, the solder heat resistance, and the warp characteristics by the following methods.

(1) Measurement of Glass Transition Temperature (Tg)

The copper clad laminated plate was immersed in a copper etching liquid to remove the copper foil to fabricate a 5 mm square sample substrate. The sample substrate was subjected to thermomechanical analysis by a compression method using a TMA (thermomechanical analyzer) (TMA2940, available from Du Pont). The substrate for evaluation was installed in the apparatus in the Z-direction and then continuously measured twice under a measurement condition of a load of 5 g and a temperature elevation rate of 10° C./min. Tg expressed by a point of intersection of different tangents of a thermal expansion curve in the second measurement was determined and evaluated for heat resistance.

(2) Measurement of Coefficient of Thermal Expansion

The copper clad laminated plate was immersed in a copper etching liquid to remove the copper foil to fabricate a 5 mm square sample substrate. The sample substrate was subjected to thermomechanical analysis by a compression method using a TMA (thermomechanical analyzer) (TMA2940, available from Du Pont). The substrate for evaluation was installed in the apparatus in the X-direction and then continuously measured twice under a measurement condition of a load of 5 g and a temperature elevation rate of 10° C./min. An average coefficient of thermal expansion at from 30° C. to 100° C. in the second measurement was calculated, and this was defined as a value of the coefficient of thermal expansion.

(3) Evaluation of Solder Heat Resistance

A 5 cm square sample substrate was fabricated from the copper clad laminated plate and then floated in a molten solder bath at a temperature of 288° C. for 1 minute. Subsequently, the appearance of the sample substrate was observed to evaluate the solder heat resistance (4) Evaluation of Warp Amount The warp amount of the sample substrate was evaluated by shadow moire analysis with TherMoire PS200 available from AKROMETRIX. The substrate had a sample size of 40 mm×40 mm and a measuring area of 36 mm×36 mm. The sample was heated from room temperature to 260° C. and then cooled to 50° C. to measure the warp amount.

Examples 1-10 and Comparative examples 1-3

The components (a)-(d), a curing accelerator (e), and an inorganic filler (f) as described below were mixed in a blending proportion (parts by mass) shown in Tables 1-3 by using methyl ethyl ketone as a dilution solvent to obtain a uniform varnish having a resin content of 65% by mass.

Subsequently, a 0.1 mm-thick E-glass cloth was impregnated and coated with the above-mentioned varnish and then dried by heating at 160° C. for 10 minutes to obtain a prepreg with a resin content of 50 mass %.

Four sheets of this prepreg were deposited. On the top and the bottom of the deposited prepreg, an 18 μm-thick electrolytic copper foil was disposed, followed by pressing under a pressure of 2.5 MPa at a temperature of 230° C. for 90 minutes to obtain a copper clad laminated plate. The measurement and evaluation results of the obtained copper clad laminated plate are shown in Tables 1-3.

(a) Maleimide compound
Bis(4-maleimidophenyl)methane
3,3'-dimethyl-5,5'-diethyl-4,4'-diphenylmethane bismaleimide (b) Silicone compound
X-22-161A (available from Shin-etsu Chemical Industry Ltd., amine equivalent: 800)
X-22-161B (available from Shin-etsu Chemical Industry Ltd., amine equivalent: 1500)
KF-8012 (available from Shin-etsu Chemical Industry Ltd., amine equivalent: 2200)

(c) Compound with a phenolic hydroxyl group
Bisphenol A
p-aminophenol (d) Thermosetting resin
Biphenylaralkyl epoxy resin [available from Nippon Kayaku Co., Ltd., trade name: NC-3000-H]
Novolac cyanate resin [available from Lonza Japan Ltd., trade name: PT-30]

(e) Curing accelerator: G-8009L (addition reactant of a hexamethylene diisocyanate resin and 2-ethyl-4-methylimidazole: compounds represented by the above-mentioned formula (III))

(f) Inorganic filler: Fused silica [available from Admatechs Company Limited, trade name: SC2050-KNK)

Other Compounds
Diaminodiphenylmethane (Comparative example)
2,2-bis[4-(aminophenoxy)phenyl]propane (Comparative example)

TABLE 1

|  | Example 1 | Example 2 | Example 3 | Example 4 | Example 5 |
|---|---|---|---|---|---|
| Resin composition (parts by mass) | | | | | |
| (a) Maleimide compound | | | | | |
| Bis(4-maleimide phenyl)methane | 40 | 40 | 40 | 40 | 40 |
| 3,3'-dimethyl-5,5'-diethyl-4,4'-diphenylmethane bismaleimide | | | | | |
| (b) Silicone compound | | | | | |
| X-22-161A | 15 | 15 | | | |
| X-22-61B | | | 15 | 15 | |
| KF-8012 | | | | | 15 |
| (c) Compound with a phenolic hydroxyl group | | | | | |
| Bisphenol A | 5 | | 5 | | 5 |
| p-aminophenol | | 5 | | 5 | |
| (d) Thermosetting resin | | | | | |
| Biphenylaralkyl epoxy resin | 40 | 40 | 40 | 40 | 40 |
| Novolac cyanate resin | | | | | |

TABLE 1-continued

|  | Example 1 | Example 2 | Example 3 | Example 4 | Example 5 |
|---|---|---|---|---|---|
| (e) Curing accelerator | | | | | |
| G-8009L | 0.5 | 0.5 | 0.5 | 0.5 | 0.5 |
| (f) Inorganic filler | | | | | |
| Fused silica | 50 | 50 | 50 | 50 | 50 |
| Performance of laminate plate | | | | | |
| (1) Glass transition temperature (° C.) | 260 | 260 | 265 | 260 | 265 |
| (2) Coefficient of thermal expansion (ppm/° C.) | 8.5 | 8.5 | 9.0 | 8.5 | 9.0 |
| (3) Solder heat resistance | Excellent | Excellent | Excellent | Excellent | Excellent |
| (4) Warp amount (μm) | 50 | 45 | 45 | 40 | 45 |

TABLE 2

|  | Example 6 | Example 7 | Example 8 | Example 9 | Example 10 |
|---|---|---|---|---|---|
| Resin composition (parts by mass) | | | | | |
| (a) Maleimide compound | | | | | |
| Bis(4-maleimide phenyl)methane | 40 | 40 | 40 | 40 | |
| 3,3'-dimethyl-5,5'-diethyl-4,4'-diphenylmethane bismaleimide | | | | | 40 |
| (b) Silicone compound | | | | | |
| X-22-161A | 15 | 15 | 15 | 15 | 15 |
| X-22-161B | | | | | |
| KF-8012 | | | | | |
| (c) Compound with a phenolic hydroxyl group | | | | | |
| Bisphenol A | 5 | | 5 | | 5 |
| p-aminophenol | | 5 | | 5 | |
| (d) Thermosetting resin | | | | | |
| Biphenylaralkyl epoxy resin | | | | | |
| Novolac cyanate resin | 40 | 40 | 40 | 40 | 40 |
| (e) Curing accelerator | | | | | |
| G-8009L | 0.5 | 0.5 | 0.5 | 0.5 | 0.5 |
| (f) Inorganic filler | | | | | |
| Fused silica | 50 | 50 | 50 | 50 | 50 |
| Performance of laminate plate | | | | | |
| (1) Glass transition temperature (° C.) | 250 | 250 | 250 | 250 | 255 |
| (2) Coefficient of thermal expansion (ppm/° C.) | 8.5 | 8.0 | 8.5 | 8.0 | 8.5 |
| (3) Solder heat resistance | Excellent | Excellent | Excellent | Excellent | Excellent |
| (4) Warp amount (μm) | 45 | 40 | 40 | 45 | 45 |

TABLE 3

|  | Comparative example 1 | Comparative example 2 | Comparative example 3 |
|---|---|---|---|
| Resin composition (parts by mass) | | | |
| (a) Maleimide compound | | | |
| Bis(4-maleimide phenyl)methane | 40 | 40 | |
| 3,3'-dimethyl-5,5'-diethyl-4,4'-diphenylmethane bismaleimide | | | 40 |
| (b') Other compounds | | | |
| Diaminodiphenylmethane | 15 | | |
| 2,2-bis[4-(aminophenoxy)phenyl]propane | | 15 | 15 |
| (c) Compound with a phenolic hydroxyl group | | | |
| Bisphenol A | 5 | | 5 |
| p-aminophenol | | 5 | |
| (d) Thermosetting resin | | | |
| Biphenylaralkyl epoxy resin | | | |
| Novolac cyanate resin | 40 | 40 | 40 |

TABLE 3-continued

| | Comparative example 1 | Comparative example 2 | Comparative example 3 |
|---|---|---|---|
| (e) Curing accelerator | | | |
| G-8009L | 0.5 | 0.5 | 0.5 |
| (f) Inorganic filler | | | |
| Fused silica | 50 | 50 | 50 |
| Performance of laminate plate | | | |
| (1) Glass transition temperature (° C.) | 260 | 255 | 255 |
| (2) Coefficient of thermal expansion (ppm/° C.) | 11.0 | 10.5 | 11.0 |
| (3) Solder heat resistance | Excellent | Excellent | Expanded |
| (4) Warp amount (μm) | 75 | 55 | 55 |

As are clear from Tables 1-3, the examples of the present invention have an excellent glass transition temperature, coefficient of thermal expansion, solder heat resistance, and warp characteristics. On the other hand, in the comparative examples, any of the glass transition temperature, coefficient of thermal expansion, solder heat resistance, and warp characteristics are inferior when compared with those of the examples.

INDUSTRIAL APPLICABILITY

A multi-layered printed wiring board produced by using the laminated plate produced by laminating and molding the prepreg obtained from the resin composition of the present invention has excellent glass transition temperature, coefficient of thermal expansion, solder heat resistance, and warp characteristics. The multi-layered printed wiring board is useful as a highly integrated printed wiring board for an electronic device.

The invention claimed is:

1. A resin composition comprising: (a) a maleimide compound with at least two N-substituted maleimide groups per molecular structure; (b) a silicone compound with at least one amino group per molecular structure; and (c) a compound with an amino group and a phenolic hydroxyl group per molecular structure.

2. The resin composition according to claim 1 further comprising (d) a thermosetting resin.

3. The resin composition according to claim 2, wherein the compound (d) has an epoxy group and/or a cyanate group per molecular structure.

4. The resin composition according to claim 1, wherein the silicone compound (b) has at least two amino groups per molecular structure.

5. The resin composition according to claim 1, wherein the silicone compound (b) has an amino group at both ends.

6. The resin composition according to claim 1, wherein the silicone compound (b) has an amino group at either end.

7. The resin composition according to claim 1, wherein the silicone compound (b) has an amino group at a side chain.

8. The resin composition according to claim 1, wherein the silicone compound (b) has an amino group at a side chain and at least one end.

9. The resin composition according to claim 1 further comprising (e) a curing accelerator represented by the following general formula (I) or (II),

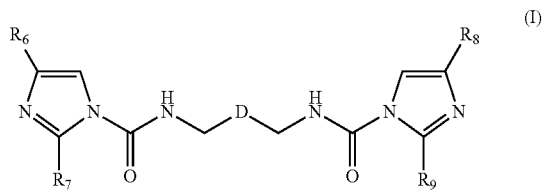

wherein $R_6$, $R_7$, $R_8$, and $R_9$ each independently represents a hydrogen atom, an aliphatic hydrocarbon group with 1-5 carbon atoms, or a phenyl group; and D is an alkylene group or an aromatic hydrocarbon group,

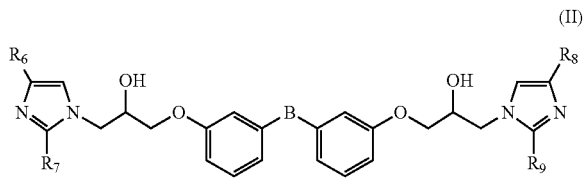

wherein $R_6$, $R_7$, $R_8$, and $R_9$ each independently represents a hydrogen atom, an aliphatic hydrocarbon group with 1-5 carbon atoms, or a phenyl group; and B represents a single bond or any one of an alkylene group, an alkylidene group, an ether group, and a sulfonyl group.

10. The resin composition according to claim 1 further comprising (f) an inorganic filler.

11. A prepreg formed by using the resin composition according to claim 1.

12. A laminated plate formed by using the prepreg according to claim 11 through laminated molding.

13. A printed wiring board produced by using the laminated plate according to claim 12.

14. The resin composition according to claim 1, wherein the compound with the amino group and the phenolic hydroxyl group per molecular structure is selected from the group consisting of m-aminophenol, p-aminophenol, o-aminophenol, p-aminobenzoic acid, m-aminobenzoic acid, and 3,5-dihydroxyaniline.

15. The resin composition according to claim 1, wherein the compound with the amino group and the phenolic hydroxyl group per molecular structure is included in an amount of 1-50 parts by mass based on 100 parts by mass of said maleimide compound.

16. The resin composition according to claim 1, wherein the compound with the amino group and the phenolic hydroxyl group per molecular structure is selected from the group consisting of m-aminophenol and p-aminophenol.

17. The resin composition according to claim 1, wherein the compound with the amino group and the phenolic hydroxyl group per molecular structure is p-aminophenol.

\* \* \* \* \*